United States Patent
Tzeng et al.

(10) Patent No.: US 10,351,948 B2
(45) Date of Patent: Jul. 16, 2019

(54) METHOD OF DIAMOND NUCLEATION AND STRUCTURE FORMED THEREOF

(71) Applicant: National Cheng Kung University, Tainan (TW)

(72) Inventors: Yonhua Tzeng, Tainan (TW); Chih-Chun Chang, Tainan (TW)

(73) Assignee: NATIONAL CHENG KUNG UNIVERSITY, Tainan (TW)

( * ) Notice: Subject to any disclaimer, the term of this patent is extended or adjusted under 35 U.S.C. 154(b) by 330 days.

(21) Appl. No.: 15/158,634

(22) Filed: May 19, 2016

(65) Prior Publication Data

US 2016/0340777 A1  Nov. 24, 2016

(30) Foreign Application Priority Data

May 22, 2015  (TW) .............................. 104116395 A

(51) Int. Cl.
- *C23C 16/27* (2006.01)
- *H01L 21/02* (2006.01)
- *H01L 21/48* (2006.01)

(52) U.S. Cl.
CPC .......... *C23C 16/27* (2013.01); *H01L 21/0262* (2013.01); *H01L 21/02381* (2013.01); *H01L 21/02422* (2013.01); *H01L 21/02444* (2013.01); *H01L 21/02527* (2013.01); *H01L 21/4803* (2013.01); *H01L 21/02491* (2013.01)

(58) Field of Classification Search
CPC ................................................ H01L 21/02381
See application file for complete search history.

(56) References Cited

U.S. PATENT DOCUMENTS

| | | | |
|---|---|---|---|
| 2002/0048638 A1* | 4/2002 | Gruen | C23C 16/26 427/577 |
| 2007/0032089 A1* | 2/2007 | Nuzzo | B82Y 10/00 438/725 |
| 2007/0148479 A1* | 6/2007 | Ishikazi | C25D 9/08 428/469 |
| 2011/0282421 A1 | 11/2011 | Sung | |
| 2014/0231825 A1 | 8/2014 | Sung | |
| 2015/0102266 A1* | 4/2015 | Bitziou | G01N 27/308 252/502 |

FOREIGN PATENT DOCUMENTS

CN  103789746 A  5/2014

OTHER PUBLICATIONS

Yonhua Tzeng and Chih-Chun Chang, Diamond Nucleation on Graphene, 109 pages.

* cited by examiner

*Primary Examiner* — Robert T Butcher

(74) *Attorney, Agent, or Firm* — Bacon & Thomas, PLLC

(57) ABSTRACT

The present invention relates to a method of diamond nucleation, comprising the following steps: providing a substrate and forming a graphene layer on a surface of the substrate; providing a reaction chamber and disposing the substrate in the reaction chamber; providing a gas mixture in the reaction chamber, wherein the gas mixture includes a carbon-containing gas; and forming a plasma in the reaction chamber to cause the carbon-containing gas to react and form a plurality of diamond nuclei on a surface of the graphene layer. The present invention also relates to a structure formed by the aforesaid method, comprising: a substrate; a graphene layer disposed on the substrate; and a plurality of diamond particles formed on the graphene layer.

18 Claims, 7 Drawing Sheets

METHOD OF DIAMOND NUCLEATION AND STRUCTURE FORMED THEREOF

CROSS REFERENCE TO RELATED APPLICATION

This application claims the benefit of the Taiwan Patent Application Serial Number 104116395, filed on May 22, 2015, the subject matter of which is incorporated herein by reference.

BACKGROUND OF THE INVENTION

1. Field of the Invention

The present invention relates to a method of diamond nucleation and a structure formed thereof. More particularly, the present invention relates to a method of graphene induced diamond nucleation and a structure formed thereof.

2. Description of Related Art

Diamond has excellent physical, chemical, optical, mechanical, and electrical properties. For example, diamond has high thermal conductivity coefficient, chemical inertness, highest rigidity, high Young's modulus, low friction coefficient, wide energy gap, and broad optical transmission frequency-domain. As a result, polycrystalline diamond (PCD) has been widely used in industry in recent years. Polycrystalline diamond not only has excellent mechanical property similar to monocrystalline diamond, but can also be processed into any desired shape according to different purposes.

When forming diamonds on non-diamond substrates, seeding or nucleation of diamond on non-diamond substrates must be done first. Since self-nucleation without needing to place diamond particles on a substrate simplifies diamond deposition processes, there are many studies dedicated to methods of diamond self-nucleation. One kind of heterogeneous nucleation is bias-enhanced nucleation (BEN). During bias-enhanced nucleation, a negative bias voltage with respect to the plasma is applied externally on substrates. Kinetic energy of species is then increased, collision of species to substrates is increased, and nucleation is enhanced. However, uniform biasing of large areas and high flux of bias induced ion bombardment on highly-resistive substrates are more difficult during bias-enhanced diamond nucleation processes. Bias-enhanced diamond nucleation also fails to penetrate into narrow grooves in substrates in order to enhance diamond nucleation on the sidewalls of grooves where the electric field perpendicular to the sidewall surface is weak. Although some related researches have reported that additional coating layers, such as an amorphous carbon layer, can also promote nucleation. However, the nuclei formed usually are of low density and fail to distribute evenly.

Nowadays, chemical vapor deposition (CVD) is a common and well-developed method for polycrystalline diamond film formation. The precursors used are usually hydrocarbon materials, or carbon-containing materials with addition of different amounts of argon gas, hydrogen gas, oxygen gas, and nitrogen gas, etc. The polycrystalline diamond film is formed by ionizing, exciting, and decomposing gas mixtures containing the aforesaid precursors using various types of energy sources. In particular, in microwave plasma chemical vapor deposition (MPCVD), one or more reactive materials provided into reactors are first activated by microwave plasma. Ionization, decomposition, recombination, and chemical reactions of the reactive materials then occur. A solid film is then deposited on a diamond surface or a surface of non-diamond substrates having diamond nuclei. However, until now, it is still rather difficult to deposit a diamond film on substrates without diamond seeding and without negative biasing voltage using microwave plasma chemical vapor deposition.

Therefore, there is a need to develop a method of diamond nucleation without the need to perform diamond seeding or to externally apply negative bias voltage on non-diamond substrates. In addition, there is also a need to develop a method of diamond nucleation that can improve uneven distribution and penetration into grooves of substrates of diamond nuclei formed by the use of additional coating layers.

SUMMARY OF THE INVENTION

The main object of the present invention is to provide a novel method of diamond nucleation and a structure formed thereof. In particular, the method provided by the present invention can form diamond nuclei directly on non-diamond substrates without diamond seeding and external bias voltage. The method provided by the present invention can also improve uneven distribution and penetration of diamond nuclei into groves of substrates formed by the use of additional coating layers. The method provided by the present invention can produce high purity diamond crystals. Specifically, the present invention utilizes graphene, which exhibits diversified properties, to induce diamond nucleation. More specifically, the present invention utilizes the edges and surfaces of graphene where $sp^2$ carbon bond structures have been converted to $sp^a$ carbon bond structures to induce diamond nucleation.

To achieve the object of the present invention, the method of diamond nucleation provided by the present invention comprises the following steps: providing a substrate and forming a graphene layer on a surface of the substrate; providing a reaction chamber and disposing the substrate in the reaction chamber; providing a gas mixture in the reaction chamber, wherein the gas mixture includes a carbon-containing gas; and forming a plasma in the reaction chamber to cause the carbon-containing gas to react and form a plurality of diamond nuclei on a surface of the graphene layer.

A structure formed by the aforementioned method of diamond nucleation of the present invention, comprises: a substrate; a graphene layer disposed on the substrate; and a plurality of diamond particles formed on the graphene layer.

In the method of diamond nucleation and the structure formed thereof of the present invention, the substrate may be any desired objects for diamond crystal deposition. The substrate is not particularly limited as long as the substrate can withhold the temperature at which diamond nucleation processes occur. However, the substrate is preferably a silicon substrate, a silicon dioxide substrate, a silicon wafer, or a combination thereof.

In the method of diamond nucleation and the structure formed thereof of the present invention, the substrate has at least one trench and the graphene layer is formed on an opening of the trench. The trench may be formed on a surface of the substrate by any method commonly used in the art, such as an etching method. When the graphene layer is formed on the substrate without any trench, the graphene layer is attached on the substrate. However, when the graphene layer is formed on the substrate having at least one trench, the graphene layer formed on an opening of the trench is suspended on the trench.

In the method of diamond nucleation and the structure formed thereof of the present invention, the graphene layer may be formed by any method commonly used in the art without any particular limitation. For example, the graphene layer may be formed in an environment containing methane and hydrogen gas by a thermal chemical vapor deposition process. The graphene layer may be formed directly on a surface of the substrate or may be transferred onto the substrate after its formation. For example, the graphene layer may be formed on a surface of the substrate directly by any method commonly used in the art, such as by a deposition method or a coating method. The graphene layer may also be prepared first and then transferred onto the substrate by any transfer method commonly used in the art, such as by a dry or wet transfer method. In the present invention, the graphene layer may be a graphene monolayer or a plurality of graphene monolayers without any particular limitation. When the graphene layer is the plurality of graphene monolayers, the carbon-containing gas may react to form a continuous diamond film on the surface of the graphene layer.

Specifically, when the graphene layer is the plurality of graphene monolayers, the diamond particles formed on the graphene layer may be connected to each other to form the continuous diamond film.

In the method of diamond nucleation and the structure formed thereof of the present invention, no diamond seed is disposed neither on the substrate nor on the graphene layer.

In the method of diamond nucleation and the structure formed thereof of the present invention, a selected transitional metal layer, such as a tungsten layer or a molybdenum layer, may be formed between the substrate and the graphene layer. The transitional metal layer may be formed by any method commonly used in the art without any particular limitation. For example, the tungsten layer may be deposited between the substrate and the graphene layer by radio frequency magnetron sputtering.

In the method of diamond nucleation of the present invention, the chemical vapor deposition system used is not particularly limited. Any systems commonly used for diamond formation in the art may be used except plasma enhanced chemical vapor deposition and hot-filament chemical vapor deposition. However, in the present invention, the diamond nuclei are preferably formed by microwave plasma chemical vapor deposition.

In the method of diamond nucleation of the present invention, the gas mixture is not particularly limited and may be any gas mixtures commonly used in chemical vapor deposition system for diamond formation in the art. The carbon-containing gas of the gas mixture is also not particularly limited and may be any carbon-containing gases commonly used in chemical vapor deposition system in the art. However, in the present invention, the carbon-containing gas is preferably hydrocarbon gas, such as methane, acetylene, ethylene, and so on. The volume percent of the carbon-containing gas in the gas mixture is not particularly limited. However, in the present invention, a volume percent of the carbon-containing gas in the gas mixture is preferably 0.05% to 50%, and more preferably, 0.1% to 10%. Nevertheless, the person having ordinary skill in the art may adjust the content of the carbon-containing gas in the gas mixture according to different densities of diamond nucleation desired. In the present invention, the gas mixture may further comprise hydrogen gas. The volume percent of the hydrogen gas in the gas mixture is not particularly limited. However, in the present invention, a volume ratio of hydrogen to methane in the gas mixture is preferably 0 to 200, and more preferably, 10 to 100.

In the method of diamond nucleation of the present invention, the carbon-containing gas may react to form diamond nuclei in an environment with or without additional hydrogen gas. When the carbon-containing gas reacts to form diamond nuclei in an environment without hydrogen, lesser hydrogen atoms are produced. Consequently, diamond nucleation can occur at lower temperature. This is because when hydrogen atoms recombine, heat energy will be released to raise substrate temperature. As a result, lower microwave power and lower hydrogen atom content are often preferred for heat-load reduction of substrates. Since diamond nucleation can occur at lower temperature, application of diamond synthesis can be expanded. In addition, nucleation in an environment without hydrogen is much safer. Nonetheless, in the present invention, diamond nucleation may also be conducted in an environment with hydrogen (low hydrogen content). Even though higher microwave power is needed to generate plasma and the substrate temperature will be higher, but diamond nucleation can still be conducted successfully.

In the method of diamond nucleation of the present invention, the person having ordinary skill in the art may adjust the appropriate microwave power according to different microwave frequencies and reactor sizes. In the present invention, the microwave power is preferably 2000 W to 8000 W. Other parameters used in diamond nucleation of the present invention are preferably: a deposition pressure (pressure of the gas mixture) of 50 Torr to 300 Torr and a substrate temperature of 400° C. to 1200° C.

In the method of diamond nucleation of the present invention, the purity and quality of the synthesized diamonds can be increased by controlling the flow of the gas mixture. Specifically, the flow of the gas mixture is controlled to prevent carbon soots formation from excessive carbon-containing gas in the reaction chamber. In the present invention, the total flow of the gas mixture may be adjusted according to the size of the reaction chamber, the microwave power, the deposition pressure, and the content of the carbon-containing gas in the gas mixture. More specifically, the total flow of the gas mixture is adjusted to extend the residence time of the reactive gas in the reaction chamber. This assures the amount of carbon in the reaction chamber is adequate for diamond nucleation but less than the amount required by carbon soots formation by gas-phase synthesis. This prevents the plasma from being unstable (plasma will be un-stabilized by carbon soots formation by gas-phase synthesis). Thereby, the quality of diamond nucleation is increased. In particular, in the method of diamond nucleation of the present invention, when the carbon-containing gas is reacted to form diamond nuclei under a total flow of 1 sccm to 500 sccm of the gas mixture in the reaction chamber of 50 liters volume, a microwave power of 2000 W to 8000 W, and a deposition pressure of 50 Torr to 300 Torr, diamonds having high purity and high quality are synthesized.

DETAILED DESCRIPTION OF THE PREFERRED EMBODIMENT

Figure 1A:
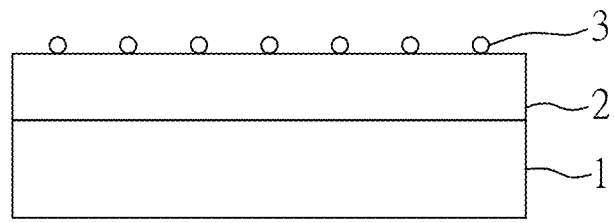
FIG. 1A is a schematic diagram showing a structure formed in Embodiment 1 of the present invention.

Other objects, advantages, and novel features of the present invention will become more apparent from the following detailed description when taken in conjunction with the accompanying drawings.

Embodiment 1

In the present embodiment, a graphene monolayer is formed in an environment containing methane gas, hydrogen gas, and argon gas by a thermal chemical vapor deposition process. The graphene monolayer formed is then transferred onto a silicon dioxide/silicon wafer substrate by a wet transfer method. The substrate is next disposed in a reaction chamber operating a microwave plasma chemical vapor deposition system. In the reaction chamber, a gas mixture containing 1% methane diluted by hydrogen gas reacts to form a plurality of diamond nuclei on a surface of the graphene monolayer. Specifically, a total flow of the gas mixture of 5 sccm of methane and 500 sccm of hydrogen gas in the reaction chamber of 50 liters volume is reacted for 4 hr under conditions such as a microwave power of 6000 W, a deposition pressure of 50 Torr, and a substrate temperature of 850° C. No diamond seed is disposed neither on the substrate nor on the graphene layer. Both the substrate and the graphene layer are not processed by bias-enhanced nucleation.

Embodiment 2

The present embodiment is the same as Embodiment 1 except the following. In the present embodiment, the substrate has been etched to form at least one trench on a surface of the substrate by an optical lithographic process first. The graphene monolayer formed is then transferred onto an opening of the trench. The graphene monolayer is suspended on the trench.

Embodiment 3

The present embodiment is the same as Embodiment 1 except the following. In the present embodiment, a tungsten layer has been deposited on a surface of the substrate by radio frequency magnetron sputtering at 60 W for 10 min first. The graphene monolayer formed is then transferred onto the tungsten layer.

Embodiment 4

The present embodiment is the same as Embodiment 3 except the following. In the present embodiment, two graphene monolayers are transferred onto the tungsten layer.

Embodiment 5

The present embodiment is the same as Embodiment 3 except the following. In the present embodiment, three graphene monolayers are transferred onto the tungsten layer.

Embodiment 6

The present embodiment is the same as Embodiment 3 except the following. In the present embodiment, four graphene monolayers are transferred onto the tungsten layer.

Comparative Embodiment 1

The present comparative embodiment is the same as Embodiment 3 except the following. In the present embodiment, the graphene monolayer is excluded.

Comparative Embodiment 2

In the present comparative embodiment, the substrate formed in Comparative Embodiment 1 is disposed in a reaction chamber operating a microwave plasma chemical vapor deposition system. In the reaction chamber, a gas mixture containing 1% methane diluted by hydrogen gas reacts to deposit amorphous carbons on a surface of the tungsten layer and form a plurality of diamond nuclei. Specifically, a total flow of the gas mixture of 5 sccm of methane and 500 sccm of hydrogen gas in the reaction chamber of 50 liters volume is reacted for 4 hr under conditions such as a microwave power of 3000 W, a deposition pressure of 50 Torr, and a substrate temperature of 685° C. No diamond seed is disposed on the substrate. The substrate is not processed by bias-enhanced nucleation.

Comparative Embodiment 3

The present comparative embodiment is the same as Comparative Embodiment 2 except the following. In the present comparative embodiment, amorphous carbons are deposited on the graphene monolayer of Embodiment 3.

Comparative Embodiment 4

The present comparative embodiment is the same as Comparative Embodiment 2 except the following. In the present comparative embodiment, a graphene monolayer is disposed on the amorphous carbons of Comparative Embodiment 2.

Please refer to FIG. 1A. FIG. 1A is a schematic diagram showing a structure formed in Embodiment 1 of the present invention. Specifically, the structure shown in FIG. 1A is formed by synthesizing diamond crystals on a graphene monolayer on a substrate. More specifically, as shown in FIG. 1A, the structure comprises a substrate 11; a graphene layer 2 disposed on the substrate 1; and a plurality of diamond particles 3 formed on the graphene layer 2.

Figure 1B:
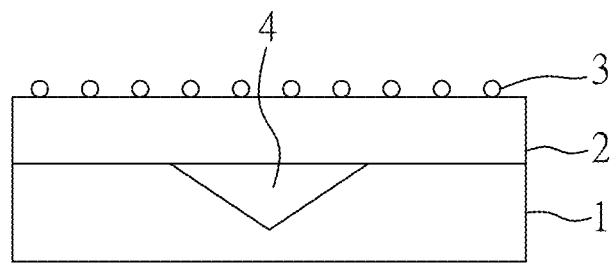
FIG. 1B is a schematic diagram showing a structure formed in Embodiment 2 of the present invention.

Please refer to FIG. 1B. FIG. 1B is a schematic diagram showing a structure formed in Embodiment 2 of the present invention. Specifically, the structure shown in FIG. 1B is formed by synthesizing diamond crystals on a graphene monolayer suspended on trenches of a substrate. More specifically, as shown in FIG. 1B, the structure comprises a substrate 1 having at least one trench 4; a graphene layer 2 disposed on an opening of the trench 4; and a plurality of diamond particles 3 formed on the graphene layer 2.

Figure 1C:
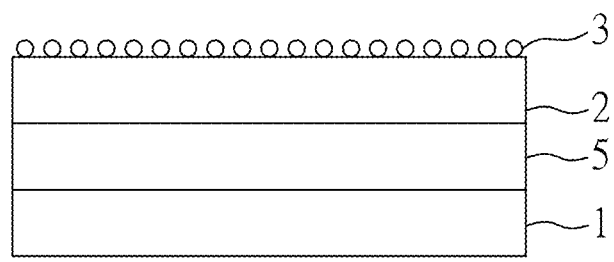
FIG. 1C is a schematic diagram showing a structure formed in Embodiment 3 of the present invention.

Please refer to FIG. 1C. FIG. 1C is a schematic diagram showing a structure formed in Embodiment 3 of the present invention. Specifically, the structure shown in FIG. 1C is formed by synthesizing diamond crystals on a graphene monolayer covering a tungsten layer on a substrate. More specifically, as shown in FIG. 1C, the structure comprises a substrate 1; a tungsten layer 5 disposed on the substrate 1; a graphene layer 2 disposed on the tungsten layer 5; and a plurality of diamond particles 3 formed on a surface of the graphene layer 2 covering the substrate 1.

Figure 2:
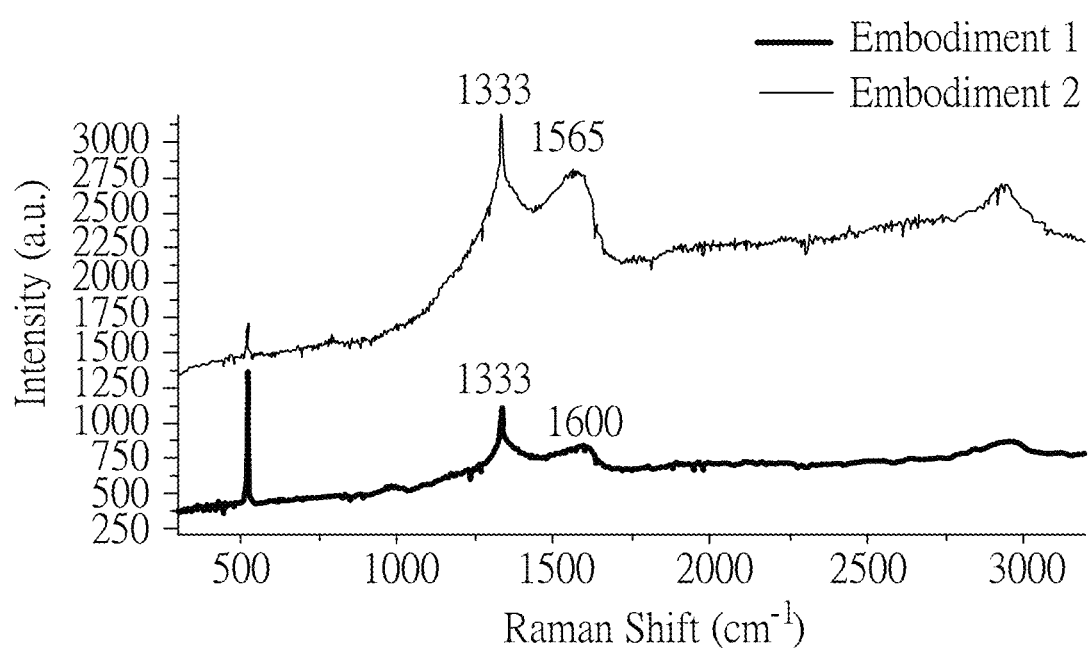
FIG. 2 shows micro-Raman spectra (excited by a 532 nm laser) of diamond crystals formed in Embodiment 1 and Embodiment 2 of the present invention.

Please refer to FIG. 2. FIG. 2 shows micro-Raman spectra (excited by a 532 nm laser) of diamond crystals formed in Embodiment 1 and Embodiment 2 of the present invention. Specifically, diamond crystals are formed on a graphene monolayer on a substrate in Embodiment 1 and diamond crystals are formed on a graphene monolayer suspended on trenches of a substrate. In order to show the micro-Raman spectra of diamond crystals formed in Embodiment 1 and Embodiment 2 more clearly, the micro-Raman spectrum of diamond crystals formed in Embodiment 2 has been shifted upward. As shown in FIG. 2, the intensity ratio of the diamond signal peak at 1333 cm$^{-1}$ to the silicon signal peak near 520 cm$^{-1}$ is higher for Embodiment 2 than for Embodiment 1. This result demonstrates that diamond crystals are formed on the graphene monolayer suspended on silicon trenches of a substrate (Embodiment 2). This result also demonstrates that diamond crystals are also suspended on silicon trenches. This causes the weaker silicon Raman scattering signal intensity measured from silicon at the bottom of silicon trenches at a distance from the suspended diamond crystals equals to the depth of the trenches. When diamond crystals are formed on a graphene monolayer covered silicon substrate, the silicon Raman scattering signal strength will be higher because silicon is very close to the diamond crystals at only a short distance of the thickness of the graphene monolayer (Embodiment 1). This result demonstrates that the graphene monolayer suspended on trenches of a substrate and the graphene monolayer on a substrate can both induce diamond nucleation.

Figure 3A:
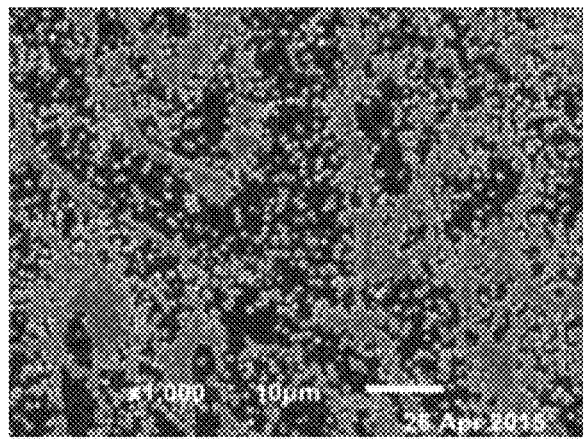
FIG. 3A is a scanning electron microscope (SEM) image of diamond crystals formed in Embodiment 3 of the present invention.
Figure 3B:
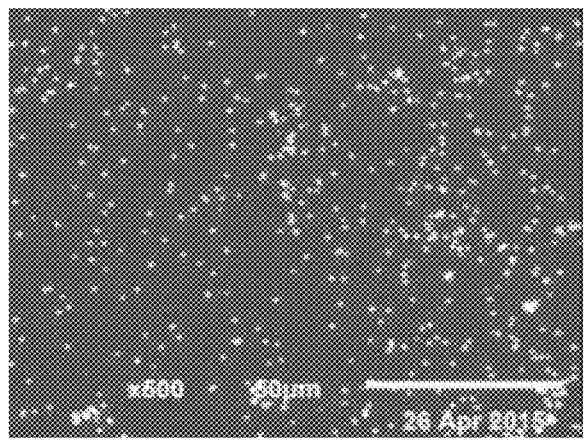
FIG. 3B is a SEM image of diamond crystals formed in Comparative Embodiment 2 of the present invention.
Figure 3C:
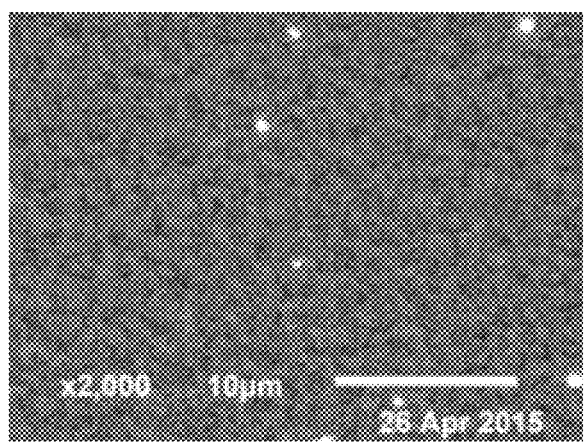
FIG. 3C is a SEM image of diamond crystals formed in Comparative Embodiment 1 of the present invention.

In order to better induce diamond nucleation on a graphene monolayer on a substrate, the present invention further includes an additional coating of a tungsten layer. Please refer to FIGS. 3A-3C. FIGS. 3A-3C show the effects of a graphene monolayer on a tungsten layer on a substrate, amorphous carbons on a tungsten layer on a substrate, and a tungsten layer on a substrate on diamond nucleation. Specifically, FIG. 3A is a SEM image of diamond crystals formed on a graphene monolayer on a tungsten layer on a substrate in Embodiment 3 of the present invention. FIG. 3B is a SEM image of diamond crystals formed on amorphous carbons on a tungsten layer on a substrate in Comparative Embodiment 2 of the present invention. FIG. 3C is a SEM image of diamond crystals formed on a tungsten layer on a substrate in Comparative Embodiment 1 of the present invention. As shown in FIGS. 3A-3C, the density of diamond crystals formed (shown by bright spots in SEM images) is the highest on the graphene monolayer on a tungsten layer on a substrate, followed by the amorphous carbons on a tungsten layer on a substrate, and then the tungsten layer on a substrate. This result demonstrates that a tungsten layer can enhance diamond nucleation induced by a graphene monolayer.

Figure 4:
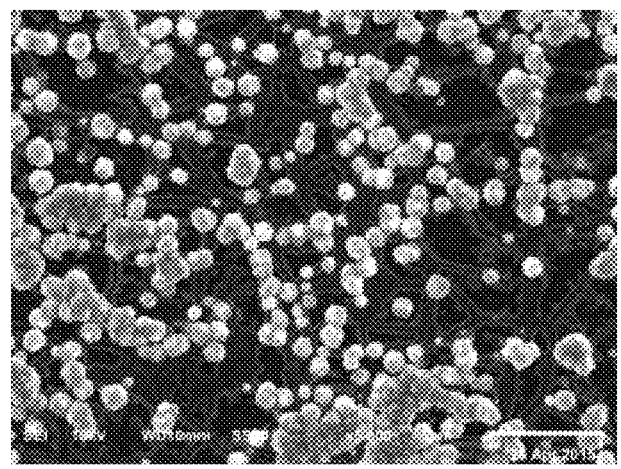
FIG. 4 is a SEM image of diamond crystals formed in Embodiment 3 of the present invention.

Please refer to FIG. 4. FIG. 4 shows a mechanism of diamond nucleation on a graphene monolayer on a tungsten layer on a substrate. Specifically, FIG. 4 is a SEM image of diamond crystals formed on a graphene monolayer on a tungsten layer on a substrate in Embodiment 3 of the present invention. As shown in FIG. 4, after diamond crystals are formed by plasma chemical vapor deposition, the graphene monolayer is etched to form a mesh-like structure (grey network structure). The surface of the tungsten layer (presumably, tungsten carbide) is exposed in holes of the mesh-like structure (dark areas). A plurality of discrete graphene islands are scattered in the holes of the mesh-like structure. Edges of the mesh-like structure (slightly brighter edges) are the reaction product of the graphene monolayer and the tungsten layer. The reaction product is a hybrid of nanocarbons in various phases including those with sp$^3$ structure at the edges and tungsten carbide. Diamond nucleation preferentially occurs at the edges of the graphene monolayer on the tungsten layer on a substrate.

Figure 5A:
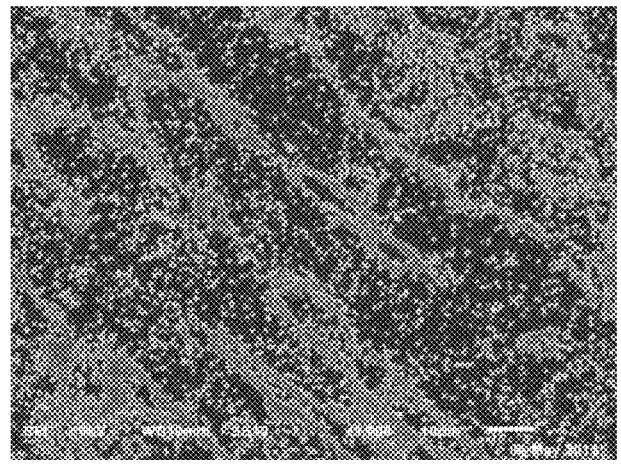
FIG. 5A is a SEM image of diamond crystals formed in Embodiment 3 of the present invention.
Figure 5B:
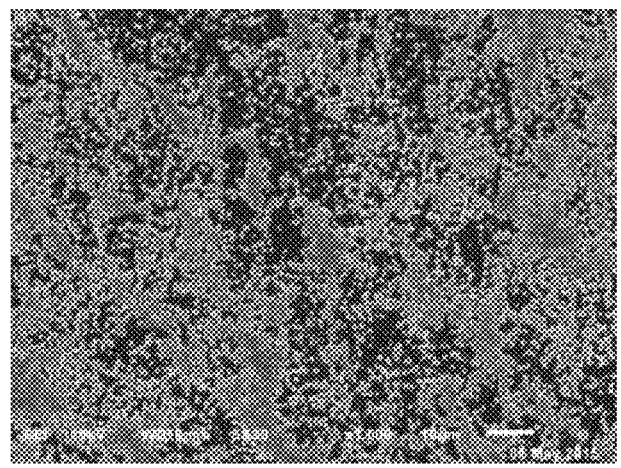
FIG. 5B is a SEM image of diamond crystals formed in Embodiment 4 of the present invention.
Figure 5C:
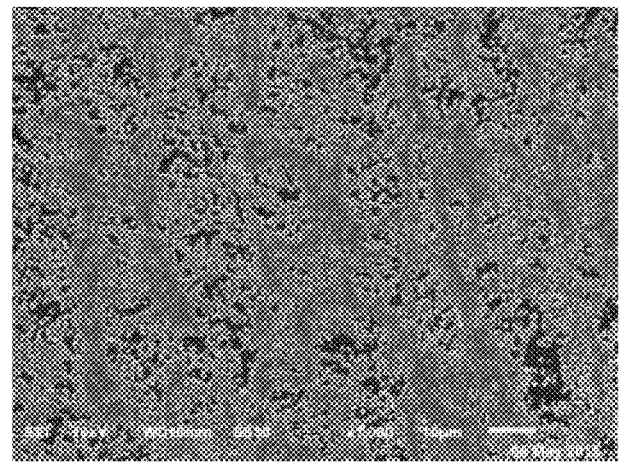
FIG. 5C is a SEM image of diamond crystals formed in Embodiment 5 of the present invention.
Figure 5D:
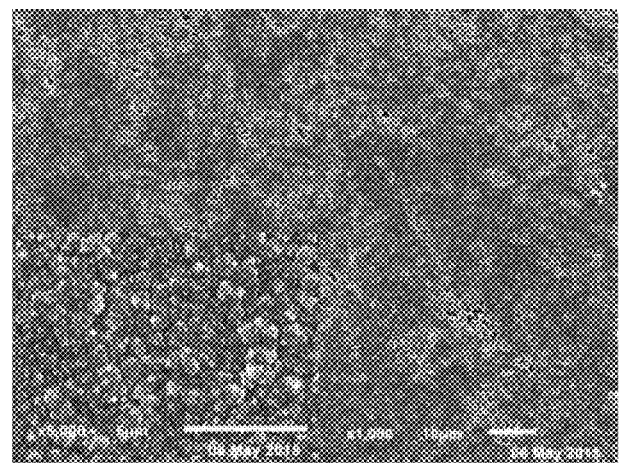
FIG. 5D is a SEM image of diamond crystals formed in Embodiment 6 of the present invention.

However, as shown in FIG. 4, the density of diamond nucleation induced by a graphene monolayer on a tungsten layer on a substrate is uneven. Thus, in order for diamond nuclei to be more evenly distributed, the present invention further includes stacking of a plurality of graphene monolayers on a tungsten layer on a substrate. Please refer to FIGS. 5A-5D. FIGS. 5A-5D show the effect of stacking a plurality of graphene monolayers on diamond nucleation density. Specifically, FIG. 5A is a SEM image of diamond crystals formed on one graphene monolayer on a tungsten layer on a substrate in Embodiment 3 of the present invention. FIG. 5B is a SEM image of diamond crystals formed on two graphene monolayers on a tungsten layer on a substrate in Embodiment 4 of the present invention. FIG. 5C is a SEM image of diamond crystals formed on three graphene monolayers on a tungsten layer on a substrate in Embodiment 5 of the present invention. FIG. 5D is a SEM image of diamond crystals formed on four graphene monolayers on a tungsten layer on a substrate in Embodiment 6 of the present invention. As shown in FIGS. 5A-5D, as the number of graphene monolayer stacked on a tungsten layer on a substrate increases, the density of diamond nucleation increases. The synthesis of a continuous diamond film is then induced.

Figure 6A:
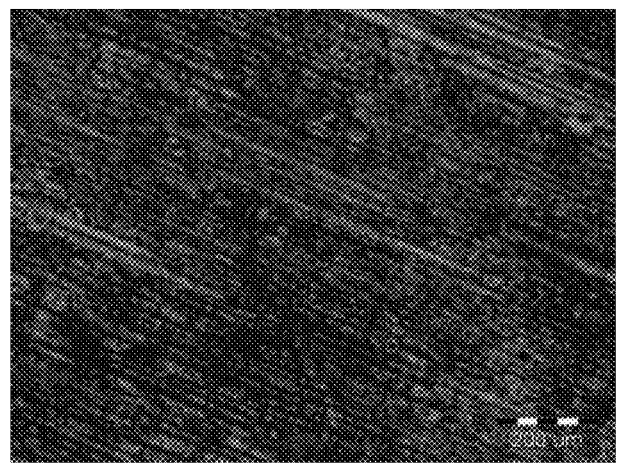
FIG. 6A is a SEM image of diamond crystals formed in Comparative Embodiment 3 of the present invention.

In order to clarify if the enhanced diamond nucleation by stacking a plurality of graphene monolayers is caused by higher carbon supersaturation resulted from disposing additional carbons on a substrate, FIG. 6A shows the effect of amorphous carbons on a graphene monolayer on a tungsten layer on a substrate on diamond nucleation. Specifically, FIG. 6A is a SEM image of diamond crystals formed on amorphous carbons on a graphene monolayer on a tungsten layer on a substrate in Comparative Embodiment 3 of the present invention. As shown in FIG. 6A, the effect of amorphous carbons on a graphene monolayer on a tungsten layer on a substrate on diamond nucleation is the same as one graphene monolayer without amorphous carbon on a tungsten layer on a substrate (both having the same density of diamond nucleation). This result demonstrates that the amorphous carbons deposited on the graphene monolayer do not participate significantly in the diamond nucleation induced by graphene monolayer.

Figure 6B:
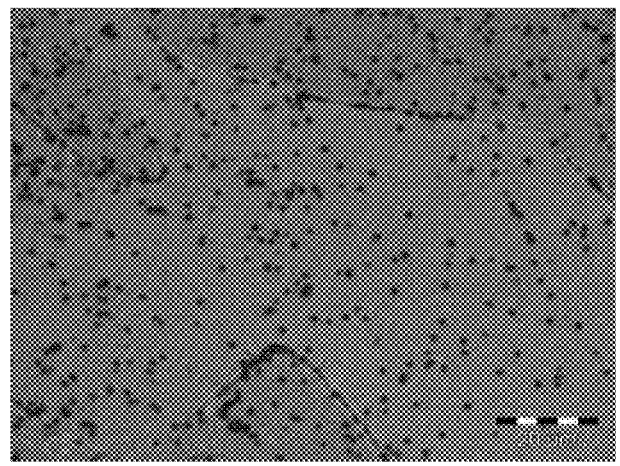
FIG. 6B is a SEM image of diamond crystals formed in Comparative Embodiment 4 of the present invention.

In order to better understand the effect of the tungsten layer on diamond nucleation induced by graphene monolayer, FIG. 6B shows the effect of a graphene monolayer on amorphous carbons on a tungsten layer on a substrate on diamond nucleation. Specifically, FIG. 6B is a SEM image of diamond crystals formed on a graphene monolayer on amorphous carbons on a tungsten layer on a substrate in Comparative Embodiment 4 of the present invention. As shown in FIG. 6B, the density of diamond nucleation induced by the graphene monolayer on amorphous carbons on a tungsten layer on a substrate is reduced. This result demonstrates that the graphene monolayer needs to directly contact the tungsten layer in order to enhance the diamond nucleation induced by graphene monolayer.

Accordingly, in the method of diamond nucleation and the structure formed thereof of the present invention, diamond crystals can form on non-diamond substrates without diamond seeding and without the need to externally apply a bias voltage (bias enhanced nucleation). In addition, uneven distribution and penetration into groves of substrates of diamond nuclei formed by the use of additional coating layers can also be improved. Specifically, in the method of diamond nucleation and the structure formed thereof of the present invention, diamond crystals can form on non-diamond substrates only by disposing one graphene layer on a substrate. By disposing a tungsten layer between a graphene layer and a substrate, the nucleation and growth of diamond crystals induced by graphene can be further enhanced at the interphase between the graphene layer and the tungsten layer. By disposing a plurality of graphene monolayers, a continuous diamond film can be formed.

Although the present invention has been explained in relation to its preferred embodiment, it is to be understood that many other possible modifications and variations can be made without departing from the spirit and scope of the invention as hereinafter claimed.

What is claimed is:

1. A method of diamond nucleation, comprising the following steps:
   providing a substrate and forming a graphene layer on a surface of the substrate, wherein the substrate is a non-diamond substrate;
   providing a reaction chamber and disposing the substrate in the reaction chamber;
   providing a gas mixture in the reaction chamber, wherein the gas mixture includes a carbon-containing gas; and
   forming a plasma in the reaction chamber without externally applying a bias voltage to cause the carbon-containing gas to react and form a plurality of diamond nuclei on a surface of the graphene layer;
   wherein no diamond seed is disposed neither on the substrate nor on the graphene layer.

2. The method as claimed in claim 1, wherein the substrate is a silicon substrate, a silicon dioxide substrate, a silicon wafer, or a combination thereof.

3. The method as claimed in claim 1, wherein the substrate has at least one trench and the graphene layer is formed on an opening of the trench.

4. The method as claimed in claim 1, wherein the graphene layer is a graphene monolayer or a plurality of graphene monolayers.

5. The method as claimed in claim 1, wherein a tungsten layer is formed between the substrate and the graphene layer.

6. The method as claimed in claim 5, wherein the tungsten layer is deposited between the substrate and the graphene layer by radio frequency magnetron sputtering.

7. The method as claimed in claim 1, wherein the diamond nuclei are formed by microwave plasma chemical vapor deposition.

8. The method as claimed in claim 1, wherein the carbon-containing gas is methane.

9. The method as claimed in claim 1, wherein the gas mixture further comprises hydrogen gas.

10. The method as claimed in claim 1, wherein the carbon-containing gas is reacted to form diamond nuclei under a total flow of 1 sccm to 500 sccm of the gas mixture in the reaction chamber of 50 liters volume, a microwave power of 2000 W to 8000 W, and a deposition pressure of 50 Torr to 300 Torr.

11. The method as claimed in claim 1, wherein the carbon-containing gas is reacted to form diamond nuclei at a substrate temperature of 400° C. to 1200° C.

12. The method as claimed in claim 4, wherein when the graphene layer is the plurality of graphene monolayers, the carbon-containing gas is reacted to form a continuous diamond film on the surface of the graphene layer.

13. A structure formed by the method as claimed in claim 1, comprising:
   a substrate;
   a graphene layer disposed on the substrate; and
   a plurality of diamond particles formed on the graphene layer.

14. The structure as claimed in claim 13, wherein the substrate is a silicon substrate, a silicon dioxide substrate, a silicon wafer, or a combination thereof.

15. The structure as claimed in claim 13, wherein the graphene layer is a graphene monolayer or a plurality of graphene monolayers.

16. The structure as claimed in claim 13, further comprising a tungsten layer disposed between the substrate and the graphene layer.

17. The structure as claimed in claim 13, wherein the diamond particles are connected to each other to form a continuous diamond film.

18. The structure as claimed in claim 16, wherein the graphene layer directly contacts the tungsten layer.

* * * * *